United States Patent [19]

Crosby

[11] Patent Number: 4,916,543
[45] Date of Patent: Apr. 10, 1990

[54] CIRCULAR SCAN STREAK TUBE WITH ELECTRONIC MEMORY AND READOUT

[75] Inventor: Philip S. Crosby, Portland, Oreg.

[73] Assignee: Tektronix, Inc., Beaverton, Oreg.

[21] Appl. No.: 294,221

[22] Filed: Jan. 9, 1989

[51] Int. Cl.⁴ ............................................. H04N 5/335
[52] U.S. Cl. .............................. 358/217; 250/213 VT; 358/213.11
[58] Field of Search ................................ 358/217–219, 358/213.11, 209; 250/213 VT

[56] References Cited

U.S. PATENT DOCUMENTS 4,471,378  9/1984  Ng ........................................ 358/217
4,555,731 11/1985  Zinchuk ........................ 250/213 VT

OTHER PUBLICATIONS

W. Sibbett, et al., "Photochron ICC Streak Tube for 300 MHz Circular-Scan Operation" SPIE vol. 491 High Speed Photography (Strasbourg 1984).
W. Sibbett and W. E. Sleat, "A Photochron ICC Circular-scan Streak Camera with CCD Readout", SPIE vol. 674 High Speed Photography (Pretoria 1986) pp. 543–558.
A. Finch, et al, "Electron-sensitive CCD Readout Array for a Circular-sçan Streak Tube", SPIE vol. 591 Solid State Imagers and Their Applicaitons (1985) p. 31.
C. B. Johnson, et al., "Circular-scan streak tube with solid-state readout" vol. 19, No. 20 Applied Optics (Oct. 15, 1980).
D. L. Bowley, "Measuring Ultrafast Pulses," Lasers & Optronics, Sep. 1987, pp. 81–83.
SPIE vol. 570, Large Area CCD Image Sensors for Scientific Applications, (1985) M. M. Blouke, D. L. Heidtmann, B. Corrie and M. L. Lust of Tektronix, Inc., Beaverton, Oreg.; and J. R. Janesick of JPL, Pasadena, Calif.

Primary Examiner—Stephen Brinich
Attorney, Agent, or Firm—John D. Winkelman; Alexander C. Johnson, Jr.

[57] ABSTRACT

A circular scan streak tube system for recording fast optical data includes a target having a first array of detection elements and a second array of corresponding storage elements. Changes in the scanning electron beam current representing optical events are detected and stored in the first array. The first and second arrays are segmented into two halves for continuous operation. Data stored in one half of the first array are transferred into the corresponding storage elements while data are written into the other half of the first array. Data stored in the first array are transferred in parallel to the second array. After a triggering event, the data are shifted circumferentially through the second array for output as serial data. The target is formed in a unitary planar semiconductor substrate having a buried channel for storing and conducting electric charge representing the stored data.

23 Claims, 6 Drawing Sheets

CIRCULAR SCAN STREAK TUBE WITH ELECTRONIC MEMORY AND READOUT

BACKGROUND OF THE INVENTION

The invention relates to the field of streak tubes and more particularly to circular scan streak tubes.

Circular scan streak tube (CSST) systems have been proposed for detecting, recording and temporally resolving optical events on the order of picoseconds. Much of the investigation in this field has been conducted as part of developing a spaceborne laser ranging system. Ranging applications, however, may be conducted with a pair of laser pulses, or a periodic series of pulses. In the latter case, CSST receiving equipment can be synchronized with the outgoing emissions to allow detecting low-level returning signals by summing (integrating) the resulting optical event signals. Work in the ranging application, accordingly, has not adequately addressed the detection, storage and readout of random data, particularly over record lengths longer than a single streak tube scan period.

A fundamental limitation of streak tube data readout is that optical events occur and can be recorded as data faster than the data can be read out electronically. This limitation constrains real time recording of optical events to a brief interval triggered by the event to be recorded. Additionally, triggering recordal from the event itself inherently misses initial data, so it becomes necessary to continuously record and store data to save initial information.

Circular scan streak tubes overwrite or sum the stored data during each successive scan, so storage is limited to only the number of pixels ($m=2\pi$) in a single circumference of the target. Merely increasing the size of the target and number of pixels is subject to practical limitations. One is the economics of making large arrays. Another limitation is that lateral deviations of the swept electron beam must be kept small in high-time-resolution devices to minimize differences in transit time between peripheral and axial electrons.

Several possible kinds of readouts for circular scan streak tubes have been considered. The Photochron IIC streak tube as reported in 1984 included a phosphor screen at the output of the tube, covered by a fiber optic faceplate. The streaked output images were recorded photographically on film. See W. Sibbett et al, "Photochron IIC streak tube for 300 MHz circular-scan operation," SPIE Vol. 491 *High Speed Photography* (Strasbourg 1984). This method provides a data record length limited to a single scan.

Later, improved signal detection was reported in W. Sibbett and W. E. Sleat, "A Photochron IIC Circular-scan Streak Camera with CCD Readout", SPIE Vol. 674 *High Speed Photography* (Pretoria 1986), pp 543–558 and A. Finch, et al, "Electron-sensitive CCD Readout Array for a Circular-scan Streak Tube," SPIE Vol. 591 *Solid State Imagers and Their Applications* (1985), pp 31–37. Both of these papers describe the Photochron IIC as a system including a circular array target comprising an array of photodiodes as sensing elements and a CCD shift register to read out the resulting charge. While sensitivity was improved, this arrangement is no less limited in record length to data collected over a single circular scan of the electron beam. After one scan, it is necessary to blank the writing beam, or deflect it off of the electron-beam-sensitive portion of the target to avoid overwriting.

C. B. Johnson, et al, "Circular-scan streak tube with solid-state readout", Vol. 19, No. 20 *Applied Optics* (Oct. 15, 1980) describes a circular-scan streak tube (CSST) having a circular photodiode array as a sensing element. The array is fiber-optically coupled to the output phosphor screen of the tube. The array readout circuitry is gated or triggered responsive to first (start) and second (stop) laser pulses to record first and second streaked output signals, respectively, on the readout array for measuring the time between the laser pulses. The acquired data thus is single-shot rather than continuous.

A commercial streak camera and readout system is the Hadland 2DR system, described in D. L. Bowley, "Measuring Ultrafast Pulses," *Lasers & Optronics*, Sept. 1987, pp 81–83. The Hadland 2DR target employs a rectangular area CCD array, fiber-optically coupled to the camera or experiment. It apparently operates in a single-scan, triggered mode.

It would be desirable to provide for a circular scan streak tube target capable of detecting and storing event signal data over a longer period of time, preferably several times the period of the electron beam scan.

Accordingly, the need remains for a circular scan streak tube target capable of providing a continuous stream of data responsive to a continuously scanning electron beam, so that data is captured and available for analysis that corresponds to a period of time before and after a triggering event.

SUMMARY OF THE INVENTION

One object of the present invention is to provide an improved circular scan streak tube target and system that ameliorates the problems discussed above.

A second object is to record ultrafast optical events without need for a pretrigger.

A further object is to enable high-resolution real-time recordal and storage of optical event data by a circular-scan streak tube for more than a single scan cycle.

Another object is to provide for acquisition and electronic readout of circular scan streak tube data with discrimination between successive sweeps.

The invention includes a streak tube target for sampling current in a scanning electron beam. The target comprises a first array of detection elements positioned along an endless closed path for detecting electrons in the beam scanned along the path and sequentially recording event signal data responsive to incident electrons. A second array of storage elements is positioned adjacent the first array. Each storage element is coupled to a corresponding one of the detection elements for receiving the event signal data from the corresponding detection elements and storing the event signal data. The target further includes transfer means for transferring the recorded event signal data in parallel from the detection elements of the first array to the corresponding storage elements of the second array for storage. Output means are coupled to the second array for reading the data out of the target. One or more arrays of intermediate storage elements may be employed between the first and second arrays to increase the stored record length.

Preferably, the first and second arrays are formed in a planar semiconductor substrate. The substrate has a first, detection surface adapted to receive the electron beam and a second, or opposite, electrode surface substantially parallel to the first surface. A doped channel is buried in the substrate below the electrode surface for receiving and conducting electric charge. The channel includes an elongate contiguous region forming the second array and a plurality of fingers extending laterally from one side of the region for forming the first array, each finger including a distal portion defining one of the detection elements. The detection surface includes an exposed region aligned with the array of detection elements and a covered region bounded by the exposed region and aligned with the array of storage elements to shield the storage elements from the electron beam. The substrate can include N-type doping along the first detection surface to provide an electric field for urging electrons toward the channel. The transfer means includes transfer electrode means extending along a path on the electrode surface overlying the distal portions of the channel fingers for transferring electronic charges from the detector elements in parallel to the corresponding storage elements. The output means includes shift electrode means extending along the electrode surface transversely over the contiguous region for serially shifting data circumferentially through the second array of storage elements and an output electrode coupled to a terminal one of the storage elements for outputting said shifted data.

In a circular embodiment of the target, the first and second arrays are positioned along concentric circular paths adjacent each other on a common plane. The contiguous region of the channel is arranged in the form of a circular arc, and the fingers extend radially therefrom. The transfer means includes transfer electrodes extending along a circular arc on the electrode surface overlying the distal portions of the fingers so that electric charges representing event signals can be shifted in parallel radially along the channel spokes to the corresponding storage elements. The output means includes shift electrodes extending along the electrode surface transversely over the contiguous region for shifting data circumferentially through the second array of storage elements to an output electrode for output as serial data.

The circular target can be segmented, preferably into upper and lower halves, although this feature readily could be extended to segment the target into thirds, fourths, etc. The target is bisected either by forming two buried circumferential channels, with a gap at either end to separate them, or by forming a single, contiguous channel and providing a negatively biased electrode to isolate two portions of the circumferential channel from each other.

The transfer means in a bisected circular target include a series of first, second and third upper transfer electrodes extending along concentric semicircular paths, radially space apart and crossing over the channel fingers. Each detection element is defined by a region of the target including a distal portion of the corresponding one of the channel fingers, a portion of the substrate surrounding said portion and the first and second electrodes. The third electrode is arranged radially intermediate the detection elements the second array of storage elements. The upper transfer electrodes receive upper half transfer control signals for conducting stored charge along the channel in the upper half of the target from the detection elements into the corresponding storage elements of the second array.

In the circular scan streak tube, the electron beam is deflected along a circular path by driving a set of orthogonal deflection plates with a pair of sinusoidal drive signals in phase quadrature and equal amplitude. The first array of detection elements is positioned along the circular path for detecting electrons in the beam. The transfer control signals are synchronized with the drive signals to transfer charge stored in the first array representing event signal data to the second array before the electron beam overwrites the data. In continuous operation, data detected in a first portion, for example, the upper half of the target as the beam traverses a first half of the circular path is transferred to the second array while the beam traverses the second half of the circular path. Similarly, data detected in the lower half of the target as the beam traverses the second half of the circular path is transferred to the second array while the beam traverses the first half of the target, etc.

To accomplish the transfer, three respective transfer signals are provided to the three transfer electrodes. The transfer signal voltages are varied sequentially such that they "squeeze" stored charge (in parallel) radially along the channel fingers. When a first electrode is driven to a positive voltage, while the other two electrodes are at a negative voltage, the distal end portion of the channel fingers is opened in the region below the first electrode for receiving and storing a collection or "packet" of charge; the low voltage applied to the second electrode tends to confine the packet to the distal end portion of the channel. As the first electrode voltage falls, and the second electrode voltage rises, the packet is conducted along the channel toward a portion beneath the second electrode, and so on. The transfer means also includes an identical second series of first, second and third lower transfer electrodes similarly extending along concentric semi-circular paths crossing over the channel fingers and defining the lower half of the target. Event signals generated in each of the upper and lower havles of the target can be transferred to the corresponding storage elements independently of transfer of event signals in the other half of the target, by driving the transfer electrodes independently of each other.

The shift means include upper shift electrodes arranged over a first semi-circular portion of the channel corresponding to the upper half of the target for shifting stored data in the upper half of the target; and lower shift electrodes arranged over a second semi-circular portion of the channel corresponding to the lower half of the target for shifting stored data in the lower half of the target. Each of the upper and lower shift electrodes includes an interleaved series of radial first, second and third shift electrodes. Three respective shift signals are provided to the three shift electrodes. The shift signal voltages are varied sequentially such that they "squeeze" stored charge to shift data circumferentially along the circular region of the channel, in a manner analogous to the transfer mechanism described above. An identical set of three shift electrodes are provided on each half of the target. Data can be shifted out of each half of the target independently by driving the upper and lower shift electrodes independently of each other. Data shifting and readout need not be synchronized with the electron beam, and conveniently may be done after the beam has been turned off or deflected off the target in response to a triggering event.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
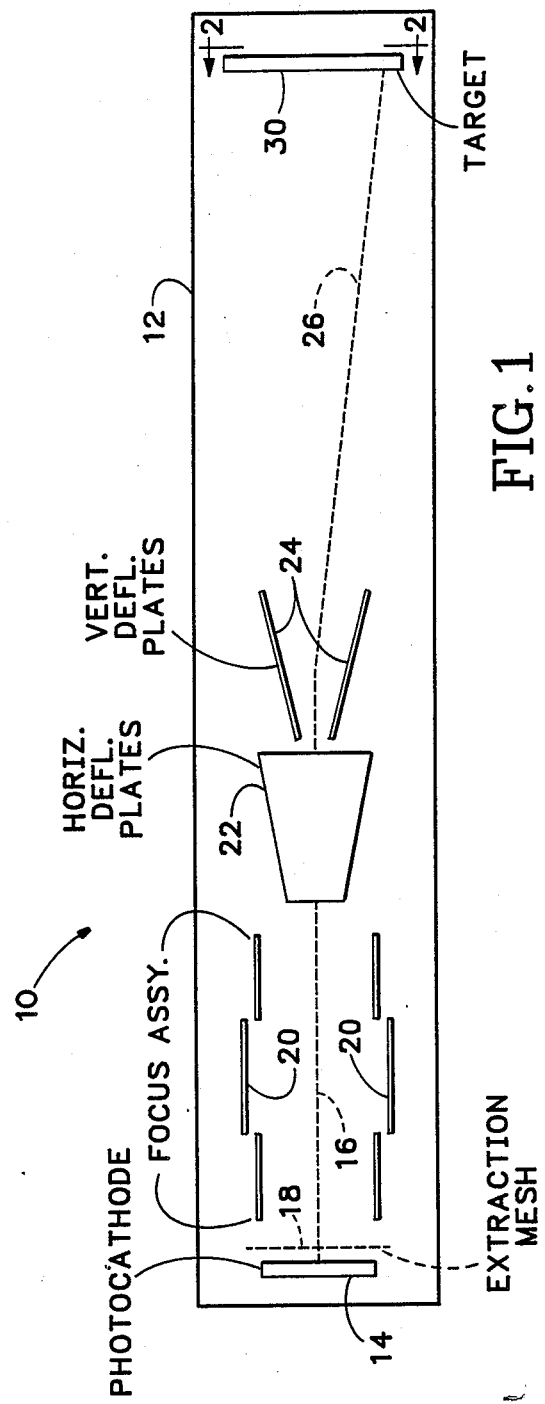
FIG. 1 is a side elevational view of a circular scan streak tube adapted to provide a circular scanning electron beam responsive to optical events input to the photocathode, and direct the beam toward a target in accordance with the invention.

FIG. 1 is a functional diagram in side view of a circular scan streak tube 10 in accordance with the invention. The entire streak tube assembly is disposed within a suitable container such as glass envelope or tube 12. The glass envelope 12 is evacuated to little or no atmosphere. The streak tube has an electron gun which includes a photocathode 14 for emitting electrons responsive to optical events impinging the photocathode at one end of the tube. A beam of electrons 16 emitted from photocathode 14 passes through an extraction mesh 18. Electron beam 16 proceeds through a focusing assembly 20 which may comprise, for example, a barrel anode, or focusing plate. Electron beam 16 next passes through horizontal deflection plates 22 and then vertical deflection plates 24. Although single deflection plates have been used, pairs of deflection plates symmetrically disposed about the beam axis are preferred.

Quadrature drive signals (FIG. 4) are provided to the horizontal and vertical deflection plates 22, 24 to deflect the beam along a continuous path on a target 30 As is known, driving the horizontal and vertical deflection plates with a pair of equal amplitude sinewave signals in phase quadrature results in deflecting the electron beam 26 about a circular path. Target 30 is disposed near an end of the tube opposite the electron gun for receiving the deflected electron beam 26. While a circular path is used in the preferred embodiment, the beam could be deflected along any convenient closed path, such as, for example, an ellipse or FIG. 8. The target must, of course, be configured to coincide with the path traversed by the electron beam. A circular target is convenient as the electron beam can be deflected by a pair of sinusoidal drive signals in phase quadrature, as is known, and these signals, in turn, are useful in carrying out the transfer and shifting of stored event signal data, as described below.

Figure 2:
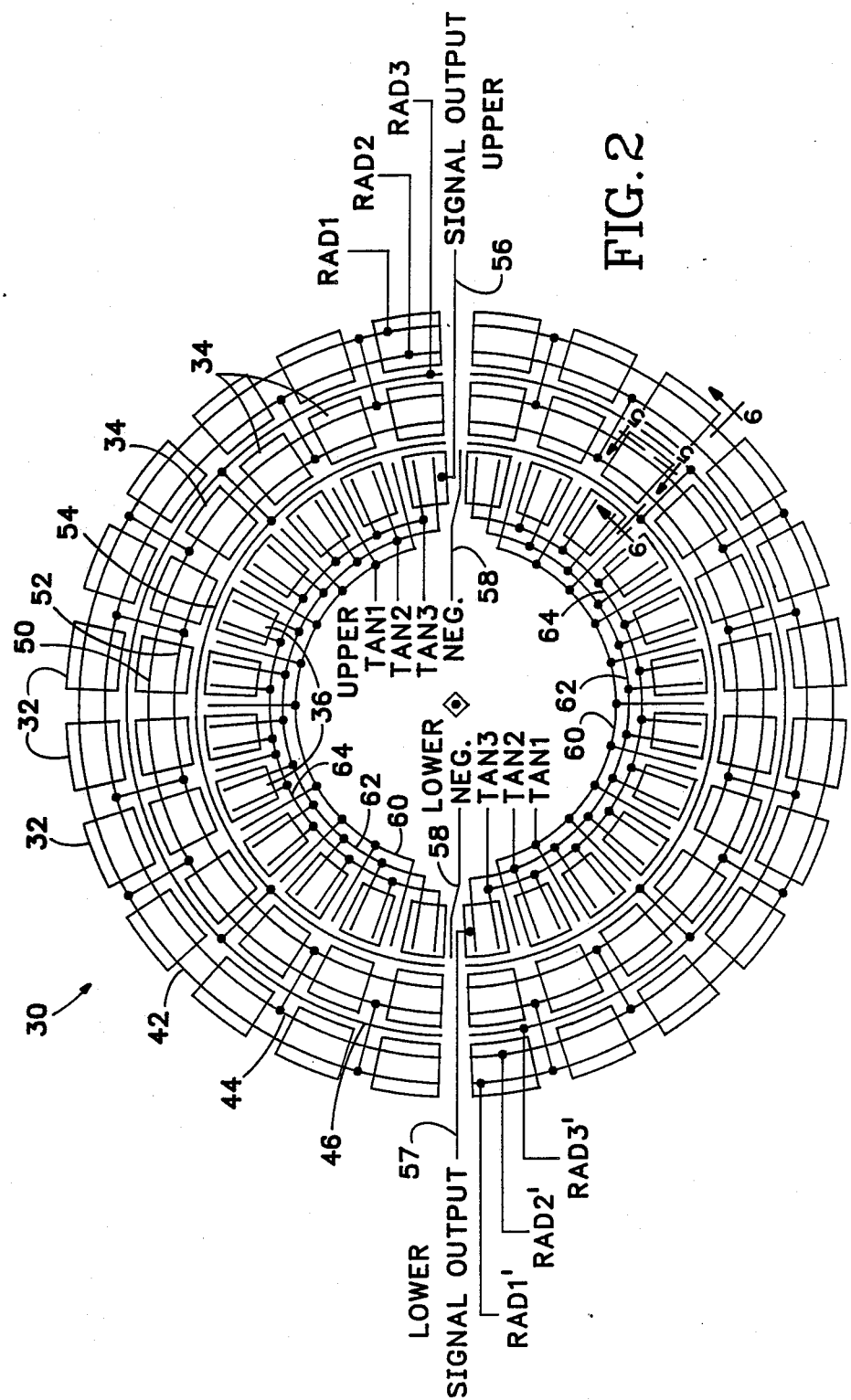
FIG. 2 is a plan view of the target taken along lines 2—2 in FIG. 1 showing the circular arrays of detection elements and storage elements and showing the layout of and interconnection of data transfer and shift electrodes.

A functional illustration of target 30 is shown in FIG. 2. The target includes a series of detection elements or pixels 32 represented rectangles. A first circular array of detection elements is disposed about the periphery of target 30. The size of the circle defined by the first array of detection elements 32 corresponds to the size of the circular path traced by the deflected electron beam 26 so that the electron beam strikes each of the detection elements 32 in turn as it traverses its circular path. A second circular array of intermediate storage element or pixels 34 represented as rectangles, is disposed inwardly adjacent and concentric with the first array of detection elements 32. The number of elements 34 in the second array is equal to the number of elements 32 of the first array so that there is a 1:1 correspondence of adjacent elements. A third array of final storage elements 36 is disposed inwardly adjacent the second array of detection elements 34 and concentric with the first two arrays. The number of storage elements 36 also is equal to the number of elements in each of the detection arrays so that, once again, there is a 1:1-correspondence between the elements 34 of the second array and the corresponding storage elements 36. The size of the detection and storage elements in FIG. 2 is greatly exaggerated for purposes of illustration. In a practical embodiment, the detection elements are much smaller and the outer circular array would include, for example, 1,000 or 1K (1,024) detection elements, so that a record would consist of 500 or 512 "bits".

A series of transfer electrodes are arranged over the two arrays of detection and intermediate storage elements 32, 34 for transferring event signal data in parallel from the detection elements to corresponding intermediate storage elements. A series of shift electrodes are arranged over the array of storage elements 36 for shifting the stored event signal data through the storage array and reading the data out of the target as serial data. The various electrodes are arranged such that they define upper and lower halves of the target 30.

Figure 3:
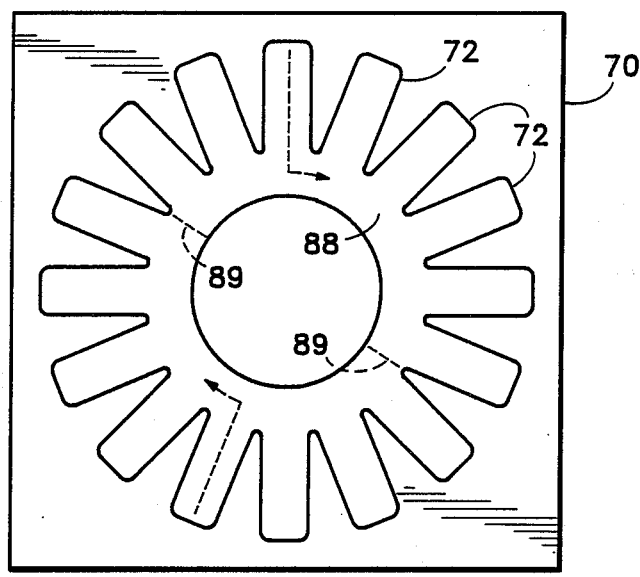
FIG. 3 is a plan view of the target of FIG. 2 prior to metallization to show the pattern of charge channel doping and directions of charge transfer during data detection, storage and readout.

Referring to FIG. 3, the target 30 is constructed on a planar substrate 70. Substrate 70 is illustrated as a square die but it may be any convenient shape. Radial dopant diffusion channels 72 form part of elements 32, 34. A circumferential channel 88, contiguous with the radial channels 72, forms part of the storage array of elements 36. The diffusion channels may all be contiguous, as illustrated. Conduction of electrons from one half of the target to the other is blocked by negatively biased electrodes 58 (FIG. 2). Alternatively, the diffusion channel 88 may be split as illustrated by dashed lines 89, thereby physically isolating the halves (or other subdivisions) of the storage array from each other.

Referring to FIG. 2, a first transfer electrode 42 defines a substantially semi-circular path crossing over detection elements 32 in the upper half of target 30. A second transfer electrode 44 similarly traverses a semi-circular path, adjacent first transfer electrode 42 and passing over the detection elements 32 at a position radially inward from the first transfer electrode 42. A third transfer electrode 46 is disposed adjacent and generally parallel to or concentric with transfer electrode 44, radially positioned intermediate the first array detection elements 32 and the second array detection elements 34. An identical series of three transfer electrodes are provided in the lower half of target 30.

A second series of intermediate transfer electrodes 50, 52, 54 are arranged similarly to transfer electrodes 42, 44, 46, respectively, except that transfer electrodes 50, 52, 54 are arranged extending over the second or intermediate array of detection elements 34. Electrodes 50, 52 are positioned over elements 34 and transfer electrode 54 is positioned radially between the second array of detection elements 34 and the storage elements 36. As before, an identical series of transfer electrodes are provided in the lower half of target 30. The intermediate transfer electrodes 50, 52, 54 are electrically connected to the first or outer series of transfer electrodes 42, 44, 46 respectively. An identical series of intermediate transfer electrodes are provided in the lower half of target 30. All of the electrodes in the upper half of the target are electrically disconnected from those in the lower half of the target so that different drive signals may be applied to operate each half of the target independent of the other, as further described below.

Figure 5:
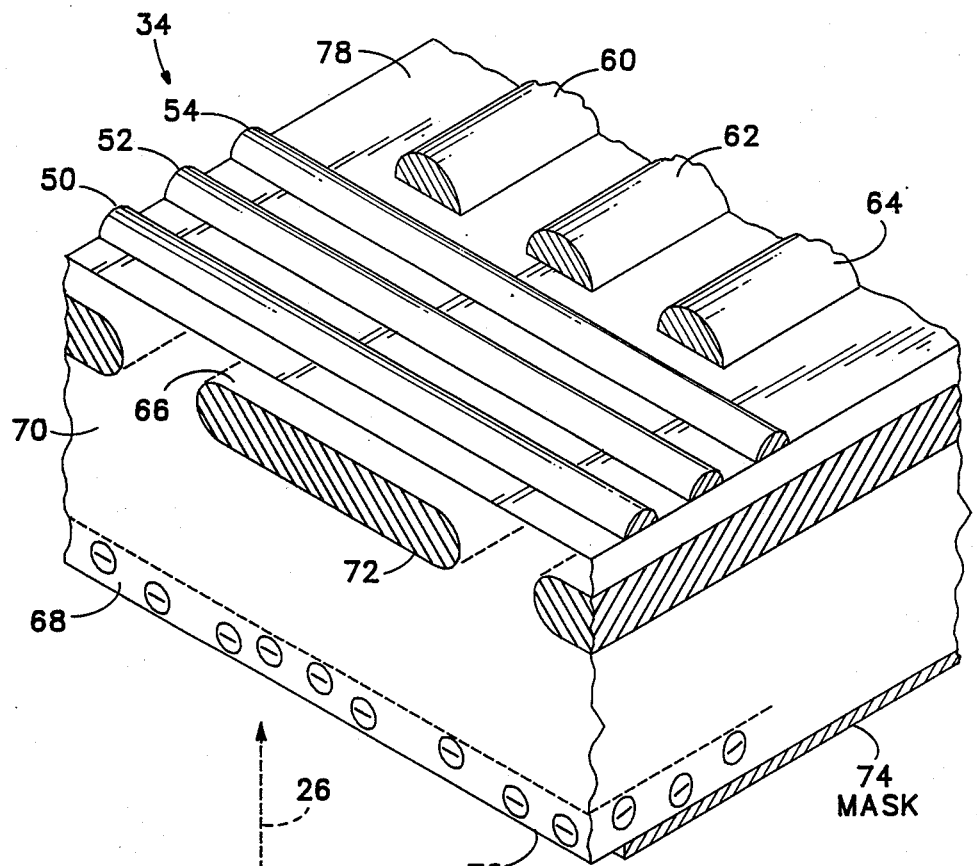
FIG. 5 is an enlarged cross-sectional perspective view of a portion of the target taken along line 4—4 in FIG. 2.
Figure 6:
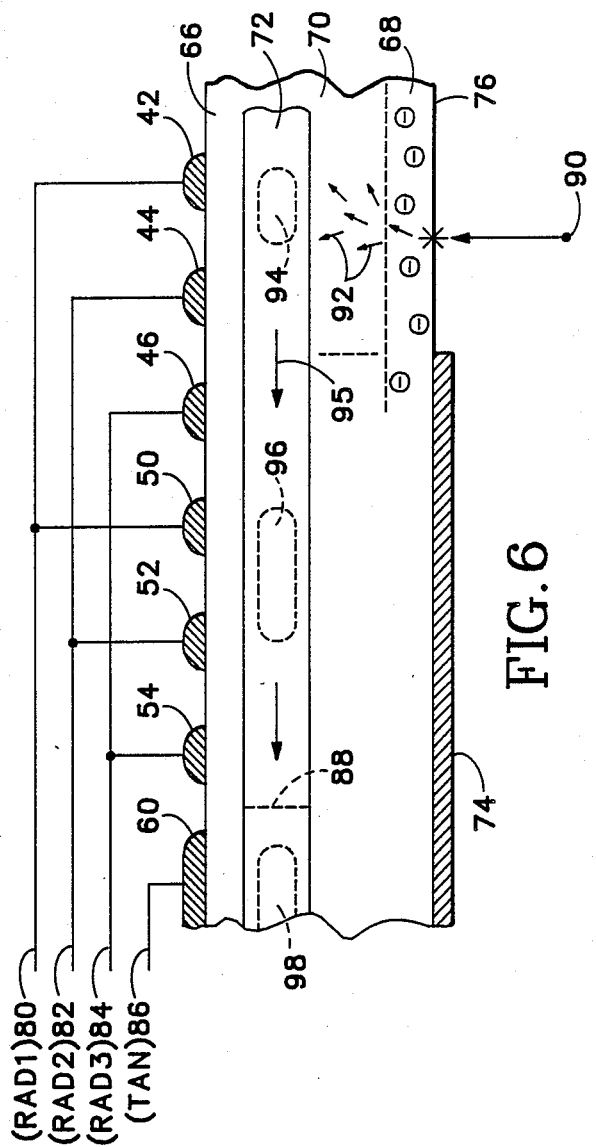
FIG. 6 is an enlarged cross-sectional view taken along line 5—5 of FIG. 2 showing a side view of a charge channel buried in a substrate, and illustrating the mechanisms of accumulating a charge in a distal end portion of the channel responsive to an energetic electrode striking an unmasked portion of the backside of the target and radial transfer of the charge along the channel.

FIGS. 5 and 6 show enlarged orthogonal sectional views of a portion of the target 30. In particular, the portion of the target 30 shown in FIG. 5 includes approximately the region comprising one of the intermediate elements 34, i.e., inward of the adjacent detection element 32. The target is fabricated in a contiguous planar substrate 70 formed of a semiconductor material such as a P-type silicon wafer. A circular inner portion of the backside of the target underlying an intermediate portion of radial channel 72 and the circumferential channel 88 is shielded by a metal layer 74 to prevent the electron beam writing in storage elements 34, 36. An outer annular backside portion of the target underlying the distal end portions of radial channels 72 forms a detection surface 76 for receiving the deflected electron beam 26 to write in detection elements 32. The substrate 70 is heavily N-doped in a shallow region 68 adjoining detection surface 76 to provide an electric field for urging electrons generally toward the channel fingers 72. Preferably, an electric field in the range of approximately 100 to 300 mv per micron is provided. This region is formed by diffusion or low-energy ion implantation followed by a fast surface anneal e.g., by laser, to limit doping depth to about one micron.

The transfer electrodes 42, 44, 46 associated with the first array of detection elements 32, transfer electrodes 50, 52 and 54 associated with the second array of elements 34 and shift electrodes 60, 62, 64 are all applied along the electrode surface 78 of the substrate 70. The transfer electrodes extend along a path on the electrode surface 78 overlying the distal portions of the channel fingers 72 for transferring electronic charges from the detector elements in parallel to the corresponding storage elements. The shift electrodes 60, 62, 64 extend along the electrode surface 78 transversely over the contiguous region 88 of the channel for serially shifting data circumferentially through the array of storage elements 36 to the corresponding output terminal 56 for the upper half of the target and output terminal 57 for the lower half of the target.

The mechanism for detecting electrons in the beam and recording event signal data responsive to incident electrons is illustrated in FIG. 6. In this cross-sectional view, an energetic electron 90 from beam 26 strikes detection surface 76 of the substrate 70. The incident electron 90 frees multiple electrons 92 in the semiconductor substrate. The N-doped region 68 provides an electric field so as to urge the free electrons 92 away from the doped region 68 and therefore toward the channel fingers 72. An electric charge thus is stored in a distal end portion of the channel. This portion corresponds to one of the detection elements 32 in FIG. 2.

OPERATION

Referring to FIG. 2, the functional operation of target 30 is as follows: The electron beam 26 traverses a circular path so that the beam strikes each of the detection elements 32 along the periphery of the target. Optical events impinging on the photocathode 14 give rise to a change in the current of electron beam 26. This current change is detected in a detection element 32 which is receiving the electron beam at the time of the change in current. This event signal data responsive to incident electrons is stored as an electron charge in the detection element 32 and remains after the beam passes. While the beam is traversing one half of target 30, the data stored in the first or outer array of detection elements 32 in the other half of the target are transferred in parallel to the array of intermediate elements 34. When the electron beam returns to the first half of the target, new data is written into the first array of detection elements 32. Meanwhile, data written in the detection elements in the lower half of the target likewise is transferred in parallel to the second array of intermediate storage elements 34 in the lower half of the target. In this way, data is continuously written into the detection elements without overwriting prior data. A data record having a length equal to the number of detection elements in the first array in one half of the target is transferred to the intermediate array during each half cycle.

The data thus stored in the second array of intermediate storage elements 34 is transferred in parallel to the array of storage elements 36. Data transfer from the second array to the corresponding storage elements 36 is synchronized with data transfer from the outer array of detection elements so as to occur simultaneously therewith. Data transfer from the second array of intermediate storage elements to the storage elements occurs in one-half of the target at a time, as described above. In this way, the effective record length is equal to the number of detection elements around a full circle of the target. If the electron beam stops or is deflected off the target at any given time, data written during the preceding half-cycle is stored in the outer semi-circular array and data written during the half-cycle preceding that half-cycle remains stored in the second array of intermediate storage elements in the half of the target last being written.

Adjacent ones of the storage elements 36 are coupled to each other so as to form a serial shift register for transferring event signal data from one storage element to the next. The storage elements in one half of the target form a first shift register while the storage elements in the second, or other, half of the target form a second, independent shift register. An output terminal 56 is connected to a terminal one of the storage elements in the upper half of the target and an output terminal 57 is coupled to a terminal one of the storage elements in the lower half of target 30. Data is shifted serially through each of the target halves in the same direction. Thus, in FIG. 2, event signal data stored in the storage elements 36 and the upper half of the target are serially shifted clockwise and output as serial data at output terminal 56. Event signal data stored in the storage elements in the lower half of target 30 similarly are serially shifted clockwise and output at output terminal 57. The serial transfer of event signal data stored in the storage elements need not necessarily be synchronized with the parallel transfer of event signal data between the detection array and the intermediate storage elements. The shifting of serial data must, of course, be synchronized with the parallel transfer of data into the storage elements.

A minimum of one array of detection elements 32, of course, is required. Likewise, one array of storage elements 36 is required. While one array of intermediate storage elements 34 are illustrated in FIG. 2 as preferred, the arrangement illustrated obviously could be extended to a greater number of arrays of intermediate storage elements, thereby increasing the effective record length of the target. Only the outer array of detection elements 32 is exposed to the electron beam for detecting electrons in the beam.

Figure 4:
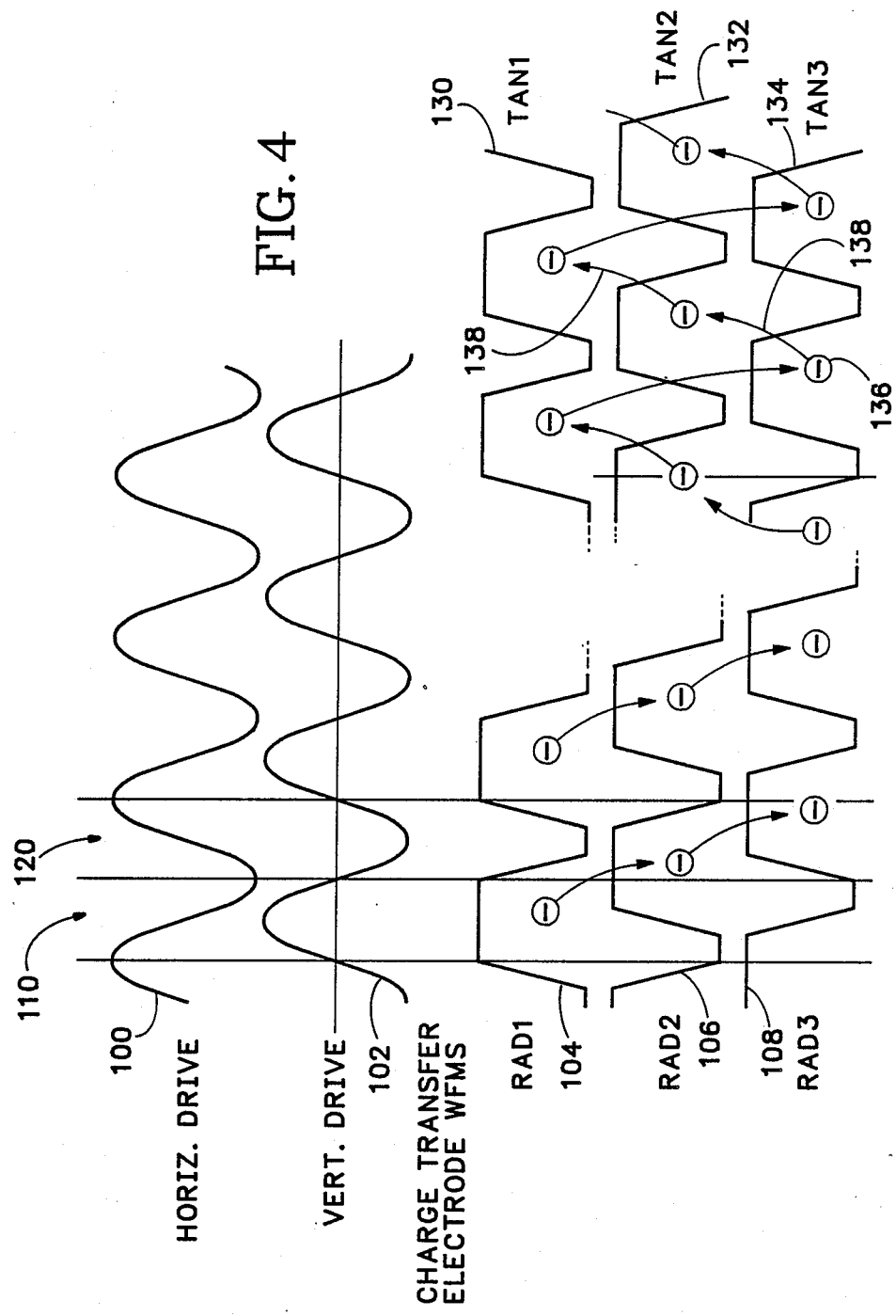
FIG. 4 is a timing diagram illustrating the timing relationships between the horizontal drive and vertical drive signals provided to the respective deflection plates in the electron gun of FIG. 1, the three charge transfer electrode wave forms and the three shift electrode wave forms. The charge transfer and shift wave forms are shown for the top half of the target of FIG. 2; the charge transfer wave forms for the lower half are delayed 180°.

Referring now to FIG. 4, a horizontal drive waveform 100 and vertical waveform 102 are shown in phase quadrature. These two drive signals are applied to the horizontal deflection plates 22 and vertical deflection plates 24 in the electron gun of FIG. 1 for deflecting the electron beam along a circular path. Transfer signals Rad1, Rad2 and Rad3 are generated by known methods such that they exhibit the chopped sinusoidal waveforms shown in FIG. 4 and have respective phase relationships relative to the horizontal and vertical drive signals as illustrated and further explained below.

The transfer signal waveforms illustrated in FIG. 4 are provided to the transfer electrodes in the top half of the target. A first transfer signal, Rad1, is provided via conductor 80 to transfer electrodes 42 and 50. A second transfer signal, Rad2, is provided via a conductor 82 to transfer electrodes 44 and 52. A third transfer signal, Rad3, is provided via a conductor 84 to transfer electrodes 46 and 54. The Rad1, Rad2, and Rad3 signal voltages are varied sequentially to transfer the charge collection along channel 72 from a first position 94 in the channel, corresponding to a detection element 32, to a second intermediate position 96 in the channel, corresponding to intermediate storage element 34 and finally into a third position 98 in the circumferential region 88 (FIG. 3) of the channel which corresponds to storage element 36. The waveforms provided to the bottom half of the target have the same form and phase relationship relative to each other but are 180 degrees delayed relative to the waveforms shown in FIG. 4.

Vertical drive signal 102 is positive and therefore the electron beam is traversing the top half of the target during a time interval 110. The time interval 110 is further divided into three sub-parts. During the first part of time interval 110 (a half cycle of the electron beam scan), Rad1 signal 104 is high (i.e., positive) and Rad2 signal 106 is low (i.e., negative). Referring to FIG. 6, the high voltage applied to the transfer electrode 42 opens the distal end portion of channel finger 72 in the region below electrode 42 for receiving and storing a collection of charge in position 94. The low voltage of Rad2 signal applied to adjacent transfer electrode 44 repels electrons in the channel and therefore tends to confine the charge collection to the distal end portion of channel 72 generally below transfer electrode 42.

Turning to FIG. 4, during a second portion of time interval 110, it may be observed that Rad1 signal 104 remains high, Rad2 signal 106 transitions from a low state to a high state, and Rad3 signal 108 drops from a high state to a low state. Referring again to FIG. 6, it may be seen that these transitions have the effect of allowing the charge collection to spread into the region of channel 72 beneath electrode 44. At the same time, the falling voltage of the Rad3 signal 108, applied to electrode 46, tends to repel the collected charge and thereby restrict it to the region of the channel beneath electrodes 42 and 44. Finally, in the last subportion of time interval 110, Rad1 signal remains high, Rad2 signal remains high, and Rad3 remains low.

During the next half cycle, identified in FIG. 4 as time interval 120, Rad1 signal drops to a low state while the Rad3 signal rises to a high voltage level. The negative potential on electrode 42 tends to repel collected charge from the distal portion of channel 72 while the positive voltage on electrode 46 attracts the charge, thereby causing the charge to conduct along channel 72 in the direction indicated by the arrow 95 in FIG. 6. During a second portion of time interval 120, Rad1 remains low, while Rad2 and Rad3 are at high voltages, in order to transfer the stored charge further along the buried channel 72. In this way, charge stored in the distal end of channel 72 responsive to the electron beam is shifted from the first array of detection elements 32 to the second array of intermediate storage elements 34, i.e., to an intermediate position along the radial channel 72 generally beneath electrodes 50 and 52. Simultaneously, charge previously collected in the intermediate storage elements 34 is shifted into the corresponding storage elements 36 in the circumferential region of the channel. As the electron beam traverses the lower half of the target, event signal data is detected and stored in the same fashion.

When a triggering event is detected or a predetermined scanning interval has elapsed, the means for generating the Rad1, Rad2, and Rad3 transfer signals is disabled, so that no new data is transferred into the storage array of elements 36. The stored data may then be serially shifted out of the target by means of applying a series of shift signals Tan1, Tan2 and Tan3 to the shift electrodes 60, 62 and 64, respectively. The interconnection of the shift electrodes is shown in FIG. 2.

Referring again to FIG. 4, shift signal Tan1 exhibits a waveform 130, shift signal Tan2 exhibits a waveform 132 and shift signal Tan3 exhibits a waveform 134. The waveforms 130, 132 and 134 are similar to the transfer signal waveforms discussed above and have a phase relationship to each other as illustrated. Although these waveforms are illustrated in the same figure with the horizontal and vertical deflection drive waveforms, the serial shifting is done independently of the electron beam gun and may have a different frequency.

The Tan1, Tan2 and Tan3 signal voltages are varied sequentially to shift stored charge circumferentially along the circumferential portion 88 of the buried channel, in a manner analagous to the radial transfer of charge described above. Symbol 136 in FIG. 4 represents a charge packet or datum stored in one of the storage elements 36. As illustrated by arrows 138, the charge packet 136 is conducted from a storage element 36 to the next adjacent storage element over one cycle of the Tan1, Tan2 and Tan3 waveforms. Because of the layout of the shift electrodes as shown in FIG. 2, all of the data stored in the storage array simultaneously are shifted, in the manner of a serial shift register, through the circumferential channel. A signal output electrode 56 is coupled to a terminal one of the storage elements 36 for outputting serial data from the top half of the target 30. Similarly, a second signal output terminal 57 is coupled to a terminal one of the storage elements in the lower half of the target.

Serial data may be shifted out of both halves of the target simultaneously. Continuous data collection may be effected by synchronizing the serial shift waveforms Tan1, Tan2 and Tan3 with the parallel transfer signals, and continually shifting data out of the target as new data is being written. Data output from the two halves of the target may be interleaved in a random access memory, by known methods, so that a continuous record may be read from the memory that corresponds to the optical event data collected.

One example of a target, according to the present invention, is constructed as follows. The planar substrate 70 is formed of a P-type (resistivity in the range of 10 ohm-cm) silicon, having a thickness approximately in the range of 10 to 20 microns. The radial channel fingers 72 are spaced 10 to 20 microns apart. They should be as close together as practicable to maximize collection efficiency. The channel 72 has N-type doping sufficient to convert it to N-type material. The channel is really the cathode of a substrate diode that is kept depleted through the action of the clock signals. Further details can be found in S.P.I.E. Vol. 570, *Large Area CCD Image Sensors for Scientific Applications,* (1985) M. M. Blouke, D. L. Heidtmann, B. Corrie and M. L. Lust of Tektronix, Inc., Beaverton, Oreg. 97077; and J. R. Janesick of JPL, Pasadena, Calif. 91109. The channel is 2 to 3 microns deep and about 15 to 20 microns wide. An insulative layer (e.g. $SiO_2$) approximately 1 micron thick is disposed over the substrate to insulate the channel 72 from the electrode on the electrode surface 78. A glass sheet is bonded over the electrode surface 78, to cover the electrodes and provide structural integrity.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A streak tube target for sampling current in a scanning electron beam, comprising:
   a first array of detection elements disposed along at least a portion of an endless closed path, said first array including a first set of elements for detecting incident electrons in a beam scanned along said path and for sequentially recording event signal data corresponding to the beam current detected by the detection elements, and a second set of elements including one coupled to a different one of each element of said first set;
   a second array of storage elements disposed adjacent the first array for storing event signal data received from the first array, said second array including a storage element coupled to a corresponding one of each detection element of said second set and storing event signal data received therefrom;
   transfer means for transferring event signal data in parallel from the detection elements of the first array to the corresponding storage elements of the second array for storage thereby; and
   output means coupled to the second array for reading stored event signal data out of the target.

2. A target according to claim 1, wherein:
   the first array is disposed along at least a portion of a first circular path;
   the second array is disposed along at least a portion of a second circular path parallel with the first path;
   the first and second arrays radially confront each other in a common plane;
   the transfer means is arranged to transfer event signal data radially from the detection elements to the corresponding storage elements; and
   the output means is adapted for shifting the data circumferentially through the second array.

3. A target according to claim 1 wherein the first and second arrays are formed in a unitary, generally planar substrate formed of a semiconductor material, the substrate including:
   a first, detection surface adapted to receive the electron beam and transmit electrons responsive to the beam to the detector elements;
   a second, electrode surface substantially parallel to the first surface; and
   a doped channel buried in the substrate below the electrode surface for conducting electric charge, the channel including an elongate contiguous region forming the second array and a plurality of fingers extending laterally from one side of the region for forming the first array, each finger including a distal portion defining one of the detection elements.

4. A target according to claim 3 wherein the transfer means includes transfer electrode means extending along a path on the electrode surface overlying the distal portions of the channel fingers for transferring electronic charges from the detector elements in parallel to the corresponding storage elements; and
   the output means includes shift electrode means extending along the electrode surface transversely over the contiguous region for serially shifting data circumferentially through the second array of storage elements and an output electrode coupled to a terminal one of the storage elements for outputting said shifted data.

5. A target according to claim 3 wherein the contiguous region is arranged in the form of a circular arc and the fingers extend radially therefrom.

6. A target according to claim 5 wherein:
   the transfer electrode means extend along a circular arc over the distal portions of the fingers so that electric charges representing event signals can be shifted in parallel radially along the channel spokes to the corresponding storage elements responsive to the transfer electrode means; and
   the output means includes shift electrode means positioned radially across the circular contiguous region so that electric charges representing a stored data in the storage elements can be shifted circumferentially long the circular region of the channel serially from each storage element to the next adjacent storage element responsive to the shift electrode means and the shifted data can be output serially at the output electrode.

7. A target according to claim 5 wherein: the transfer electrode means includes:
   a series of concentric transfer electrodes extending substantially perpendicular to the channel spokes; and
   the shift electrode means includes a substantially parallel series of shift electrodes extending radially over the circular region of the substrate.

8. A target according to claim 5 wherein the first surface of the substrate includes an exposed annular region defining a detection region in alignment with the circular array of detection elements and a covered region bounded by the annular region and aligned with the array of storage elements to shield the storage elements from electrons received from the electron beam.

9. A target according to claim 3 wherein the substrate further includes N-type doping along the first detection surface in a concentration sufficient to provide an electric field of approximately in the range of 100 to 300 mV/micron for urging electrons generally toward the channel.

10. A target according to claim 3 including shield means for masking the detection surface of the substrate except for an exposed detection region of the surface aligned with the first array so that the detection surface is responsive only to a portion of the electron beam incident on said detection region.

11. A target according to claim 2 in which the transfer means include:
   upper transfer electrode means extending along a semi-circular path defining an upper half of the target for receiving upper half transfer control signals; and
   lower transfer electrode means extending along a semi-circular path defining a lower half of the target for receiving lower half transfer control signals;
   whereby event signals generated in each of the upper and lower halves of the target can be transferred to the corresponding storage elements independently of transfer of event signals in the other half of the target.

12. A target according to claim 11 wherein the first array comprises a circular array of radial channel fingers formed in a semiconductor substrate, and upper and lower transfer electrode means each include:
   a first transfer electrode extending along a first semi-circular path crossing over the channel fingers for locally biasing the channel fingers;
   a second transfer electrode extending along a second semi-circular path over the channel fingers concentric with and radially spaced from the first semi-circular path in a direction toward the circular portion of the channel for locally biasing the channel spokes; and
   a third transfer electrode extending along a third semi-circular path over the channel fingers concentric with the first and second semi-circular paths and positioned intermediate the detection elements and the corresponding storage elements for locally biasing the channel for conducting electric charge in the spokes from the detection elements to the corresponding storage elements;
   whereby each detection element is defined by a region of the target including a portion of the corresponding one of the channel fingers, a portion of the substrate surrounding said portion and the first and second transfer electrodes.

13. A target according to claim 2 wherein the shift means include:
   upper shift electrode means arranged over a first semi-circular portion of the channel and having a pair of endpoints defining n upper half of the target for shifting stored data in the upper half bf the target; and
   lower shift electrode means arranged over a second semi-circular portion of the channel adjoining the first path at both endpoints, defining a lower half of the target for shifting stored data in the lower half of the target;
   whereby data stored in each half of the target can be shifted out of the target independently of shifting of stored data in the other half of the target.

14. A target according to claim 13 wherein the second array comprises upper and lower semicircular channels formed in a semiconductor substrate and the upper shift electrode means and the lower shift electrode means are aligned respectively over the upper and lower channels, each shift electrode means including:
   a first shift electrode having a number of substantially parallel spokes equal to the number of storage elements, each spoke extending radially over a corresponding one of the storage elements for locally biasing the channel;
   a second shift electrode having a number of substantially parallel spokes equal to the number of storage elements, each spoke extending radially over a corresponding one of the storage elements circumferentially offset from the corresponding spoke of the first shift electrode for locally biasing the channel; and
   a third shift electrode having a number of spokes equal to the number of storage elements, each spoke extending radially intermediate two adjacent storage elements for locally biasing the channel to conduct electric charge in the semi-circular channel from each storage element to the next circumferentially adjacent storage element;
   whereby data stored in a selected one of the upper half and the lower half of the target may be shifted circumferentially along the respective semi-circular channel within the selected half of the target in a predetermined direction by sequentially driving the first, second and third shift electrodes.

15. A target according to claim 1 wherein the output means is adapted to shift the stored event data through the second array for reading the data out of the target as serial data and includes an output electrode, coupled to the second array, for outputting the serial data.

16. A system for recording high-speed optical data comprising:
   a streak tube for providing an electron beam responsive to an optical event;
   deflector means associated with the streak tube for deflecting the electron beam along a circular path;
   a target within the streak tube comprising
   a first array of detection elements disposed along at least a portion of the circular path, said first array including a first set of elements for detecting electrons in the beam and recording event signal data responsive to incident electrons, and a second set of elements including one coupled to a different one of each element of said first set;
   a second array of storage elements disposed along at least a portion of a second path parallel with said circular path, each storage element coupled to a corresponding one of the detection elements of the second set and storing event signal data received therefrom;
   means for transferring the event signal data in parallel from the detection elements of the first array to the corresponding storage elements of the second array for storage;

output means coupled to an end of the second array for shifting the stored event signal data through the second array and reading the data out of the target as serial data; and synchronization means for synchronizing the transferring means to the deflection means to transfer event signal data from the first set of elements in the first array before the electron beam overwrites the data.

17. A system according to claim 16 in which the deflector means include means for providing a pair of drive signals in phase quadrature relationship and the synchronization means is synchronously coupled to the drive signals.

18. A system according to claim 16 in which:

the first array includes a semi-circular upper half and a substantially identical semi-circular lower half, positioned in the circular path to receive the electron beam such that the electron beam alternately strikes the upper half as it traverses a first half of the circular path and strikes the lower half as it traverses the other half other circular path; and the second array includes a semi-circular upper half and a substantially identical semi-circular lower half, positioned concentric with the corresponding upper and lower halves of the first array.

19. A method of detecting and sequentially recording optical events using a streak tube having a photocathode which emits an electron beam responsive to optical events detected by the photocathode and a target for receiving the electron beam, the target including a first array of detection elements disposed along a first path, said first array including a first set of elements for detecting electrons in the beam, and a second set of elements including one coupled to a different one of each element of said first set, and a second array of storage elements disposed along a second path parallel to the first path and electrically coupled to the first array, each storage element coupled to a corresponding on of the second set of detection elements, said method comprising the steps of:

scanning the electron beam along the first path;

detecting incident electrons from the beam in the first set of detection elements in the first array to record event signal data;

transferring the recorded event signal data in parallel from the detection elements of the first array to the corresponding storage elements of the second array for storage;

shifting the stored event signal data through the second array toward a terminal one of the storage elements;

outputting the stored event signal data as serial data from the terminal storage element; and synchronizing the transferring to the scanning to transfer recorded event signal data out of the first set of detection elements of the first array before the electron beam overwrites data in the first array.

20. A method according to claim 19, the first path being circular and the gun including a set of orthogonal deflection plates, wherein scanning the electron beam includes deflecting the beam along a circular path by driving the deflection plates with phase quadrature signals of a predetermined frequency; and synchronizing includes generating a transfer waveform at said frequency in a predetermined phase with the phase quadrature signals and applying the transfer waveform to the detection elements.

21. A method according to claim 19 in which:

the beam is scanned successively over first and second portions of the first array and event signal data is detected and recorded successively in the detection elements of each portion; and the recorded event signal data is transferred from the first portion of the first array into a corresponding first portion of the second array while the beam is scanning the second portion of the first array.

22. A method according to claim 21 wherein:

the transferring step includes transferring a first set of the event signal data recorded during a first scan of the first portion of the first array from the first set of detection elements of the first portion to the corresponding elements of the second set of detection elements during a scan of the second portion of the first array and transferring the first set of data from the second set of detection elements to the corresponding storage elements of the second array during a second scan of the first portion of the first array.

23. A method according to claim 22 in which two sets of event signal data recorded from two successive scans of the beam are stored in the second set of detection elements of the first array and the elements of the second array.

* * * * *

UNITED STATES PATENT AND TRADEMARK OFFICE
CERTIFICATE OF CORRECTION

PATENT NO. : 4,916,543

DATED : April 10, 1990

INVENTOR(S) : Philip S. Crosby

It is certified that error appears in the above-identified patent and that said Letters Patent is hereby corrected as shown below:

<u>Claim</u>

Col. 12, claim 6, line 56, "long" should be "along".

Col. 13, claim 13, line 66, "n" should be "an".

Col. 15, claim 18, line 22, "other" should be "of the". (2nd occur)

Signed and Sealed this

Twenty-second Day of October, 1991

Attest:

HARRY F. MANBECK, JR.

*Attesting Officer*          *Commissioner of Patents and Trademarks*